(12) United States Patent
Sung et al.

(10) Patent No.: US 10,734,550 B2
(45) Date of Patent: Aug. 4, 2020

(54) SEMICONDUCTOR DEVICE

(71) Applicant: LG INNOTEK CO., LTD., Seoul (KR)

(72) Inventors: Youn Joon Sung, Seoul (KR); Rak Jun Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/111,978

(22) Filed: Aug. 24, 2018

(65) Prior Publication Data

US 2019/0067524 A1 Feb. 28, 2019

(30) Foreign Application Priority Data

Aug. 25, 2017 (KR) .................. 10-2017-0107964

(51) Int. Cl.
*H01L 33/00* (2010.01)
*H01L 33/38* (2010.01)
(Continued)

(52) U.S. Cl.
CPC .............. *H01L 33/38* (2013.01); *H01L 33/20* (2013.01); *H01L 33/44* (2013.01); *H01L 33/62* (2013.01);
(Continued)

(58) Field of Classification Search
CPC ......... H01L 33/38; H01L 33/20; H01L 33/44; H01L 33/62; H01L 33/32; H01L 33/325; H01L 33/40; H01L 2933/0016
See application file for complete search history.

(56) References Cited

U.S. PATENT DOCUMENTS

2002/0190260 A1 12/2002 Shen et al.
2004/0061123 A1 4/2004 Shelton et al.
(Continued)

FOREIGN PATENT DOCUMENTS

WO   WO 2016/018109   2/2016
WO   WO 2017/078368   5/2017

OTHER PUBLICATIONS

European Search Report dated Jan. 22, 2019 issued in Application No. 18190726.2.

*Primary Examiner* — Kimberly N Rizkallah
*Assistant Examiner* — Alexander Belousov
(74) *Attorney, Agent, or Firm* — KED & Associates, LLP

(57) ABSTRACT

Disclosed herein is a semiconductor device including: a semiconductor structure including a first conductive semiconductor layer, a second conductive semiconductor layer, and an active layer interposed between the first conductive semiconductor layer and the second conductive semiconductor layer; a first insulating layer disposed on the semiconductor structure; a first electrode disposed on the first conductive semiconductor layer through a first hole of the first insulating layer; a second electrode disposed on the second conductive semiconductor layer through a second hole of the first insulating layer; a first cover electrode disposed on the first electrode; and a second cover electrode disposed on the second electrode, wherein the second cover electrode includes a plurality of pads, and a connecting portion configured to connect the plurality of pads, a width of the connecting portion is smallest at a central position between the adjacent pads, and an area ratio between the second cover electrode and the first cover electrode is in the range of 1:1.1 to 1:1.5.

15 Claims, 11 Drawing Sheets

(51) Int. Cl.
*H01L 33/62* (2010.01)
*H01L 33/20* (2010.01)
*H01L 33/44* (2010.01)
H01L 33/32 (2010.01)
H01L 33/40 (2010.01)

(52) U.S. Cl.
CPC ............ *H01L 33/32* (2013.01); *H01L 33/325* (2013.01); *H01L 33/40* (2013.01); *H01L 2933/0016* (2013.01)

(56) References Cited

U.S. PATENT DOCUMENTS

2005/0211997 A1 9/2005 Suehiro et al.
2015/0295142 A1* 10/2015 Huang .................. H01L 33/486
257/99

* cited by examiner (a)

(b)

(a)

(b)

(a)

(b)

(a)

(b)

(a)

(b)

(a)

(b)

SEMICONDUCTOR DEVICE

BACKGROUND

1. Field of the Invention

The present disclosure relates to a semiconductor device.

2. Discussion of Related Art

Since semiconductor devices including compounds such as GaN and AlGaN have many advantages in that energy band gaps are wide and easy to adjust, the semiconductor devices can be variously used for light emitting devices, light receiving devices, various diodes, and the like.

Particularly, the light emitting devices such as light emitting diodes and laser diodes using III-V or II-VI compound semiconductor materials can express various colors such as red, green, and blue, and emit ultraviolet light as thin film growth technologies and device materials are developed, can emit high efficiency white light when phosphors are used or colors are mixed, and have advantages in low power consumption, semi-permanent life span, quick response time, safety, and eco-friendliness when compared to conventional light sources such as fluorescent tubes and incandescent lamps.

In addition, when the light receiving devices such as a photodetector or a solar cell are manufactured using III-V or II-VI compound semiconductor materials, since the light receiving devices absorb light of various wavelength ranges to generate current due to developed device materials, light of various wavelengths from a gamma ray range to a radio frequency range can be used. In addition, since the light receiving devices can be easily used for power control, microwave circuits, or communication modules due to their advantages in quick response time, safety, eco-friendliness, easy adjustment of the device materials.

Therefore, applications of the semiconductor devices are widened to receiving modules of optical communications, LED backlights substituting for cold cathode fluorescence lamps (CCFL) forming backlights of liquid crystal display (LCD) devices, white LED lighting devices substituting for fluorescent tubes and incandescent lamps, vehicle head lights, traffic lights, and sensors configured to detect gas or fire. In addition, applications of the semiconductor devices can be widened to high frequency application circuits, other power control apparatuses, and communication modules.

Particularly, the light emitting device emitting light of an ultraviolet wavelength band can perform a curing or sterilizing action and can be used for curing, medical purpose, and sterilizing.

Recently, studies for ultraviolet light emitting devices have been actively carried out, but there is a problem in that the ultraviolet light emitting device is difficult to form as a flip chip.

SUMMARY OF THE INVENTION

The present disclosure is directed to providing an ultraviolet light emitting device in a flip chip type.

The present disclosure is also directed to providing a semiconductor device having an improved operation voltage.

The present disclosure is also directed to providing a semiconductor device having an improved optical output.

Objectives to be solved by embodiments are not limited to the above-described objectives and will include objectives and effectives which can be identified by solutions for the objectives and the embodiments described below.

According to an aspect of the present disclosure, there is provided a semiconductor device including: a semiconductor structure including a first conductive semiconductor layer, a second conductive semiconductor layer, and an active layer interposed between the first conductive semiconductor layer and the second conductive semiconductor layer; a first insulating layer disposed on the semiconductor structure; a first electrode disposed on the first conductive semiconductor layer through a first hole of the first insulating layer; a second electrode disposed on the second conductive semiconductor layer through a second hole of the first insulating layer; a first cover electrode disposed on the first electrode; and a second cover electrode disposed on the second electrode, wherein the second cover electrode includes a plurality of pads, and a connecting portion configured to connect the plurality of pads, a width of the connecting portion is smallest at a central position between the adjacent pads, and an area ratio between the second cover electrode and the first cover electrode is in the range of 1:1.1 to 1:1.5.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

The embodiments of the present disclosure may be modified into different forms or the plurality of embodiments may be combined, and the scope of the present disclosure is not limited to the embodiments which will be described below.

Although a description given in a specific embodiment is not given in other embodiments, the description may be understood to be descriptions of the other embodiments as long as there are no opposite or inconsistent descriptions given.

For example, when a feature of an element A is described in a specific embodiment and a feature of an element B is described in another embodiment, the scope of the present disclosure includes an embodiment in which the elements A and B are combined even when the embodiment is not clearly described as long as there are no opposite or inconsistent descriptions given.

In a description of the embodiment, in a case in which any one element is described as being formed on (or under) another element, such a description includes both a case in which the two elements are formed to be in direct contact with each other and a case in which the two elements are in indirect contact with each other such that one or more other elements are interposed between the two elements. In addition, when in a case in which one element is described as being formed on (or under) the other element, such a description may include a case in which one element is formed at an upper side or a lower side with respect to the other element.

Hereinafter, the embodiments of the present disclosure will be described in detail with reference to the accompanying drawings so that those skilled in the art may easily perform the present disclosure.

Figure 1:
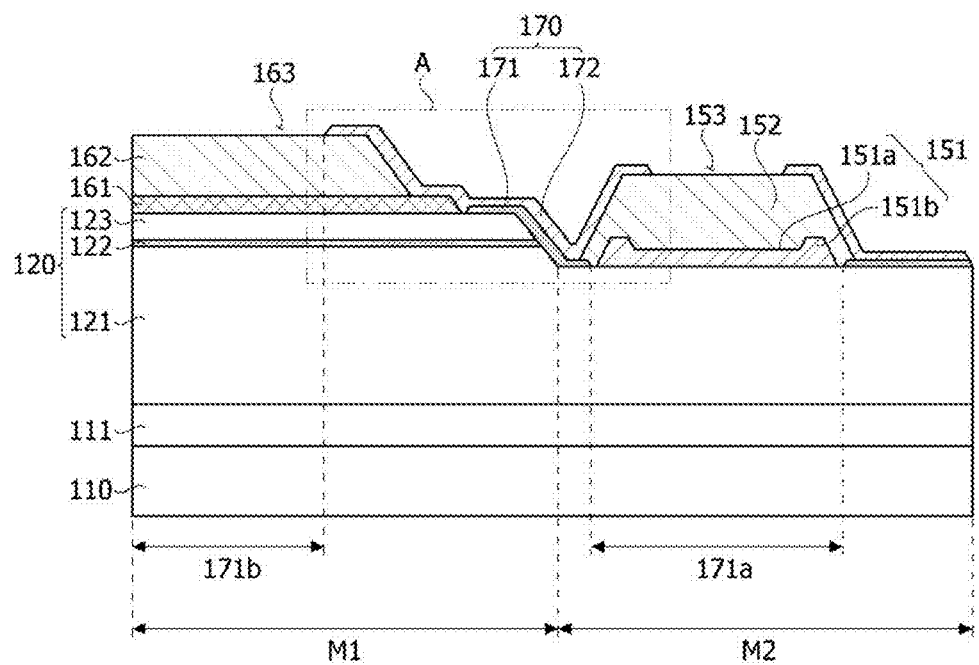
FIG. 1 is a cross-sectional view illustrating a semiconductor device according to one embodiment of the present disclosure.
Figure 2:
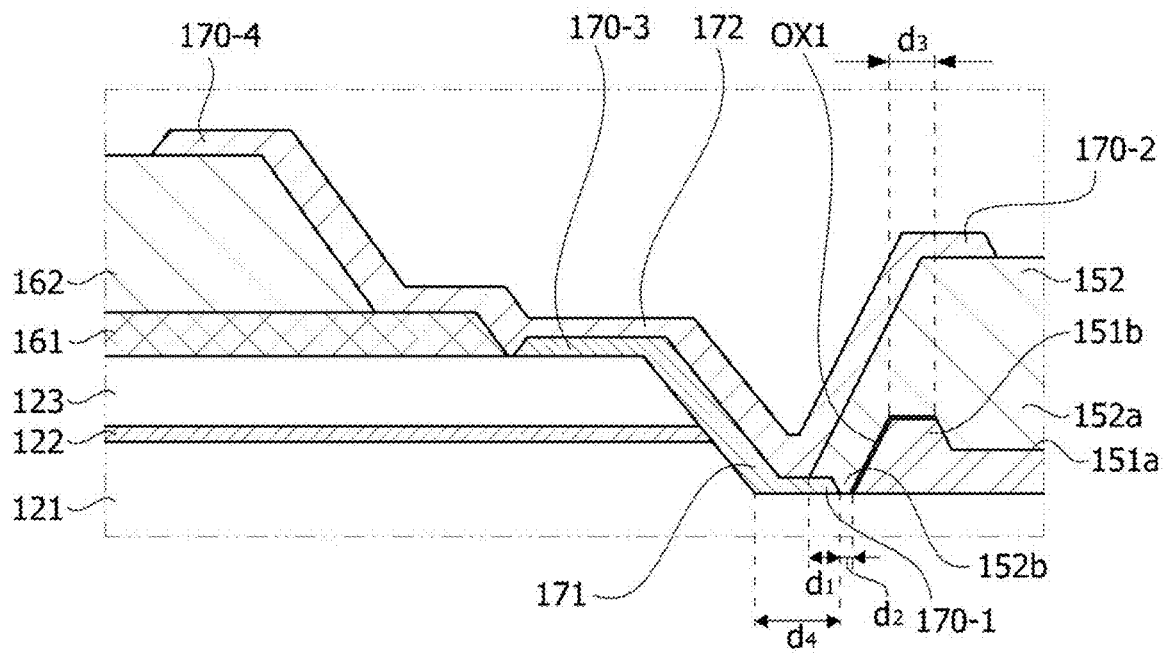
FIG. 2 is an enlarged view illustrating a region A of FIG. 1.

FIG. 1 is a cross-sectional view illustrating a semiconductor device according to one embodiment of the present disclosure, and FIG. 2 is an enlarged view illustrating a region A of FIG. 1.

Referring to FIGS. 1 and 2, the semiconductor device according to one embodiment of the present disclosure includes: a semiconductor structure 120; a first insulating layer 171 disposed on the semiconductor structure 120; a first electrode 151 disposed on a first conductive semiconductor layer 121 via a first hole 171a of the first insulating layer 171; a second electrode 161 disposed on a second conductive semiconductor layer 123 via a second hole 171b of the first insulating layer 171; a first cover electrode 152 disposed on the first electrode 151; a second cover electrode 162 disposed on the second electrode 161; and a second insulating layer 172 disposed on the first cover electrode 152 and the second cover electrode 162.

The semiconductor structure 120 according to the embodiment of the present disclosure may output light of an ultraviolet light wavelength band. For example, the semiconductor structure 120 may output light of a near-ultraviolet light wavelength band (UV-A), light of a far-ultraviolet light wavelength band (UV-B), or light of a deep-ultraviolet light wavelength band (UV-C).

For example, the light of the near-ultraviolet light wavelength band (UV-A) may have a peak wavelength in the range of 320 nm to 390 nm, the light of the far-ultraviolet light wavelength band (UV-B) may have a peak wavelength in the range of 280 nm to 320 nm, and the light of the deep-ultraviolet light wavelength band (UV-C) may have a peak wavelength in the range of 100 nm to 280 nm.

When the semiconductor structure 120 emits the light of the ultraviolet light wavelength band, the semiconductor layers of the semiconductor structure 120 may have an $In_{x1}Al_{y1}Ga_{1-x1-y1}N$ ($0 \leq x1 \leq 1$, $0 \leq y1 \leq 1$, $0x1+y1 \leq 1$) material including aluminum. Here, a composition of Al may be expressed as a ratio between a total atomic weight including an atomic weight of In, an atomic weight of Ga, and an atomic weight of Al, and the atomic weight of Al. For example, when a composition of Al is 40%, a composition of Ga is 60%, and thus the semiconductor layer may be $Al_{40}Ga_{60}N$.

In addition, while the embodiment is described, the meaning of "a composition being low or high" may be understood as "difference in a composition % (and/or point %) of the semiconductor layer." For example, when a composition of Al in the first semiconductor layer is 30% and a composition of Al in the second semiconductor layer is 60%, it may be described that an aluminum composition of the second semiconductor layer is higher than that of the first semiconductor layer by 30%.

The substrate 110 may be formed of a material selected from among sapphire (Al2O3), SiC, GaAs, GaN, ZnO, Si, GaP, InP and Ge, but is not limited thereto. The substrate 110 may be a light transmitting substrate through which light of an ultraviolet light wavelength band can transmit.

A buffer layer 111 may relax lattice mismatch between the substrate 110 and the semiconductor layers. The buffer layer 111 may be a material in which group III and V elements are combined, or may include any one among GaN, InN, AlN, InGaN, AlGaN, InAlGaN, and AlInN. In the present embodiment, the buffer layer 111 may include AlN, but is not limited thereto. The buffer layer 111 may also include a dopant, but is not limited thereto.

The first conductive semiconductor layer 121 may be formed of a III-V or II-VI compound semiconductor, or the like, and may be doped with a first dopant. The first conductive semiconductor layer 121 may be may be selected from among semiconductor materials having a composition formula of $In_{x1}Al_{y1}Ga_{1-x1-y1}N$ ($0 \leq x1 \leq 1$, $0 < y1 \leq 1$, $0 \leq x1+y1 \leq 1$), for example, AlGaN, AlN, and InAlGaN. In addition, the first dopant may be an N-type dopant such as Si, Ge, Sn, Se, and Te. In a case in which the first dopant is the N-type dopant, the first conductive semiconductor layer 121 doped with the first dopant may be an N-type semiconductor layer.

An active layer 122 may be interposed between the first conductive semiconductor layer 121 and the second conductive semiconductor layer 123. The active layer 122 is a layer in which electrons (or holes) injected through the first conductive semiconductor layer 121 meet holes (or electrons) injected through the second conductive semiconductor layer 123. As the electrons and the holes are recombined and transit to a low energy level, the active layer 122 may generate light of an ultraviolet light wavelength.

The active layer 122 may have one structure among a single well structure, a multi well structure, a single quantum well structure, a multi quantum well (MQW) structure, a quantum dot structure, and a quantum line structure, but the structure of the active layer 122 is not limited thereto.

The active layer 122 may include a plurality of well layers 126a and barrier layers 126b. Each of the well layer 126a and the barrier layer 126b may include a material having a composition formula of an $In_{x2}Al_{y2}Ga_{1-x2-y2}N$ ($0 \leq x2 \leq 1$, $0 < y2 \leq 1$, $0 \leq x2+y2 \leq 1$). The aluminum composition in the well layer 126a may be changed according to a wavelength of light emitted by the well layer 126*a*. The wavelength of the light emitted by the well layer 126*a* may decrease as a composition of aluminum therein increases.

The second conductive semiconductor layer 123 may be formed on the active layer 122, may be formed of a III-V or II-VI compound semiconductor or the like, and may be doped with a second dopant.

The second conductive semiconductor layer 123 may be formed of a semiconductor material having a composition formula of an $In_{x5}Al_{y2}Ga_{1-x5-y2}N$ ($0 \leq x5 \leq 1$, $0 < y2 \leq 1$, $0 \leq x5+y2 \leq 1$) or a material selected from among AlInN, AlGaAs, GaP, GaAs, GaAsP, and AlGaInP.

In a case in which the second dopant is a P-type dopant such as Mg, Zn, Ca, Sr, and Ba, the second conductive semiconductor layer 123 doped with the second dopant may be a P-type semiconductor layer.

The semiconductor structure 120 may include a first region M1 in which the active layer 122 and the second conductive semiconductor layer 123 are disposed on the first conductive semiconductor layer 121, and a second region M2 in which the first conductive semiconductor layer 121 is exposed. The first region M1 may be a light emitting region, and the second region M2 may be a non-light emitting region.

The first insulating layer 171 may be interposed between the first electrode 151 and the second electrode 161. Specifically, the first insulating layer 171 may include the first hole 171*a* in which the first electrode 151 is disposed and the second hole 171*b* in which the second electrode 161 is disposed.

The first electrode 151 may be disposed on the first conductive semiconductor layer 121, and the second electrode 161 may be disposed on the second conductive semiconductor layer 123.

Each of the first electrode 151 and the second electrode 161 may be an ohmic electrode. Each of the first electrode 151 and the second electrode 161 may include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but is not limited thereto. For example, the first electrode 151 may include a plurality of metal layers (for example: Cr/Al/Ni), and the second electrode 161 may include ITO.

The first electrode 151 may be electrically connected to the first conductive semiconductor layer 121 via the first hole 171*a*. The first electrode 151 may include first grooves 151*a* formed on one surface of the first electrode 151. Unlike a general visible light emitting device, electrodes of an ultraviolet light emitting device need a high temperature heat treatment for ohmic contact. For example, a heat treatment of the first electrode 151 and/or the second electrode 161 may be performed at a temperature in the range of about 600° C. to 900° C., and an oxide film OX1 may be formed on a surface of the first electrode 151 during the heat treatment. Since the oxide film OX1 may function as a resistive layer, an operation voltage may increase.

A material included in the first electrode 151 may be oxidized so that the oxide film OX1 may be formed. Accordingly, in a case in which concentrations and/or mass percentages of materials included in the first electrode 151 are not uniform or heat is not uniformly applied to the surface of the first electrode 151 due to other components during the heat treatment of the first electrode 151, the oxide film OX1 may be formed to have non-uniform thicknesses.

Accordingly, the first groove 151*a* may be formed in one surface of the first electrode 151 according to the embodiment to remove the oxide film OX1. Protrusions 151*b* surrounding the first grooves 151*a* may be formed during the above-described process.

During the heat treatment of the first electrode 151, oxidation and/or corrosion may occur on at least a part of a side surface of the first conductive semiconductor layer 121, a side surface of the active layer 122, and a side surface of the second conductive semiconductor layer 123 which are exposed between the first electrode 151 and the second electrode 161.

However, according to the embodiment, the first insulating layer 171 may extend from a part of an upper surface of the second conductive semiconductor layer 123 to the side surface of the active layer 122 and a part of the first conductive semiconductor layer 121. In addition, the first insulating layer 171 may be disposed on the side surface of the first conductive semiconductor layer 121, the side surface of the active layer 122, and the side surface of the second conductive semiconductor layer 123 between the first electrode 151 and the second electrode 161.

Accordingly, corrosion of at least a part of the side surface of the first conductive semiconductor layer 121, the side surface of the active layer 122, and the side surface of the second conductive semiconductor layer 123 can be prevented by the first insulating layer 171 during the heat treatment of the first electrode 151.

When an entire region of the first electrode 151 is etched, there is a problem in that even the first insulating layer 171 may be etched. Accordingly, in the embodiment, only a part of the first electrode 151 is etched such that an edge region remains to form the protrusion 151*b*. A width d3 of an upper surface of the protrusion 151*b* may be in the range of 1 um to 10 um. When the width d3 is 1 um or more, the first insulating layer 171 may be prevented from being etched, and when the width d3 is 10 um or less, an area of the first groove increases and a region in which the oxide film is removed increases, and thus an area of a resistive surface may decrease.

For example, in a case in which the first groove 151*a* is formed in the part of the first electrode 151, a photo resist may be coated, an exposure process may be performed, and a mask formed of the photo resist may be formed. An inclination angle may be formed between a side surface, which is disposed between an upper surface and a lower surface of the mask, and a lower surface of the substrate. Accordingly, when the inclination angle of the mask is adjusted, since a part of the protrusion 151*b* of the first electrode 151 may also be etched, a thickness of the oxide film OX1 formed on the protrusion 151*b* may also not be uniform. In some cases, parts of oxide films remaining on the protrusion 151*b* and a side surface of the first electrode 151 may also be removed.

The first cover electrode 152 may be disposed on the first electrode 151. Here, the first cover electrode 152 may include a first irregularity 152*a* disposed in the first groove 151*a*. According to the above-described structure, electrical connection between the first cover electrode 152 and the first electrode 151 is improved so that an operation voltage can be decreased. When the first electrode 151 does not include the first groove 151*a*, resistance between the first cover electrode 152 and the first electrode 151 may increase since the oxide film is not removed.

The first cover electrode 152 may cover the side surface of the first electrode 151. Accordingly, since a contact area of the first cover electrode 152 and the first electrode 151 increases, the operation voltage may further decrease. In addition, since the first cover electrode 152 covers the side surface of the first electrode 151, the first electrode 151 can be protected from permeation of external moisture or contaminants. Accordingly, reliability of the semiconductor device can be improved.

The first cover electrode 152 may include a second irregularity 152b disposed in a spacer d2 between the first insulating layer 171 and the first electrode 151. The second irregularity 152b may be in direct contact with the first conductive semiconductor layer 121. Accordingly, there may be an effect in that current injected in to the first conductive semiconductor layer 121 may be more uniformly distributed. Here, when the first cover electrode 152 is in direct contact with the first conductive semiconductor layer 121, a resistance between the first cover electrode 152 and the first conductive semiconductor layer 121 may be greater than that between the first electrode 151 and the first conductive semiconductor layer 121. A width of the spacer d2 may be in a range of about 1 um to 10 um.

The first cover electrode 152 may include a first region d1 extending onto the first insulating layer 171. Accordingly, an entire area of the first cover electrode 152 increases so that the operation voltage can decrease.

In a case in which the first cover electrode 152 does not extend onto the first insulating layer 171, an end of the first insulating layer 171 may be delaminated and detached from the first conductive semiconductor layer 121. Accordingly, moisture and/or other contaminants may permeate through the gap between the first insulating layer 171 and the first conductive semiconductor layer 121. As a result, at least a part of the side surface of the first conductive semiconductor layer 121, the side surface of the active layer 122, and the side surface of the second conductive semiconductor layer 123 may be corroded or oxidized.

Here, a ratio d4:d1 between a total area of the fourth region d4 and a total area of the first region d1 may be 1 to 1:0.15 to 1:1. The total area of the first region d1 may be less than that of the fourth region d4. Here, the fourth region d4 may be a region in which the first insulating layer 171 is disposed on the first conductive semiconductor layer 121 in a region between the first and second electrodes 151 and 161.

In a case in which the total area ratio d4:d1 is 1:0.15 or more, since the area of the first region d1 increases, and covers an upper portion of the first insulating layer 171, delamination of the first insulating layer 171 can be prevented. In addition, permeation of external moisture or contaminants can be prevented since the first cover 152 is disposed between the first electrode 151 and the second electrode 161.

In addition, in a case in which the total area ratio d4:d1 is 1:1 or less, an area of the first insulating layer 171 capable of sufficiently covering a region between the first electrode 151 and the second electrode 161 may be secured. Accordingly, corrosion of the semiconductor structure during the heat treatment of the first electrode 151 and/or the second electrode 161 may be prevented.

The second cover electrode 162 may be disposed on the second electrode 161. The first cover electrode 152 may cover a side surface of the second electrode 161, but is not limited thereto.

Each of the first cover electrode 152 and the second cover electrode 162 may be formed of at least one among Ni/Al/ Au, Ni/IrO$_x$/Au, Ag, Ni, Cr, Ti, Al, Rh, Pd, Ir, Sn, In, Ru, Mg, Zn, Pt, Au, and Hf, but is not specifically limited. However, an externally exposed outermost layer of each of the first cover electrode 152 and the second cover electrode 162 may include Au.

The second insulating layer 172 may be disposed on the first cover electrode 152, the second cover electrode 162, and the first insulating layer 171. The second insulating layer 172 may include a third hole 153 through which the first cover electrode 152 is exposed and a fourth hole 163 through which the second cover electrode 162 is exposed.

According to the embodiment, since the second insulating layer 172 is disposed on the insulating layer 171 in the region between the first electrode 151 and the second electrode 161, even in a case in which a defect occurs in the first insulating layer 171, permeation of external moisture and/or other contaminants can be prevented.

For example, in a case in which the first insulating layer and the second insulating layer are formed as one layer, a defect such as a crack may be easily expanded in a thickness direction. Accordingly, external moisture or contaminants may permeate into the semiconductor structure through the externally exposed defect.

However, according to the embodiment, since the separate second insulating layer 172 is disposed on the first insulating layer 171, a defect occurring in the first insulating layer 171 is difficult to be expanded to the second insulating layer 172. That is, an interface between the first insulating layer 171 and the second insulating layer 172 may serve to block expansion of the defect. Accordingly, corrosion or oxidation of at least a part of the side surface of the first conductive semiconductor layer 121, the side surface of the active layer 122, and the side surface of the second conductive semiconductor layer 123, due to external moisture and/or other contaminants, can be prevented. Accordingly, reliability of the semiconductor device can be improved. Here, in a case in which materials of the first insulating layer 171 and the second insulating layer 172 are different, permeation of moisture or contaminants may be more effectively prevented. That's because an internal defect is not expanded in a deposition direction in a case in which different thin films are deposited as the first insulating layer 171 and the second insulating layer 172. This may be defined as a defect decoupling effect.

Each of the first insulating layer 171 and the second insulating layer 172 may be formed of at least one selected from the group consisting of SiO2, SixOy, Si3N4, SixNy, SiOxNy, Al2O3, TiO2, AlN, and the like. While the second insulating layer 172 is formed, a part of a boundary portion between the first insulating layer 171 and the second insulating layer 172 may also disappear so that one insulating layer 170 may be formed.

Additionally, a first bump electrode 181 (see FIG. 9) may be further disposed on the first cover electrode 152, and second bump electrodes 182 (see FIG. 9) may be further disposed on the second cover electrode 162, but are not limited thereto. The first bump electrode and the second bump electrodes may also be formed when a chip is mounted on a circuit substrate.

The insulating layer 170 may include a first insulator 170-1 interposed between the first conductive semiconductor layer 121 and the first cover electrode 152 and a second insulator 170-2 disposed on an upper surface of the first cover electrode 152.

The first insulator 170-1 may extend into the first cover electrode 152. Accordingly, permeation of moisture and contaminants into the semiconductor structure 120 may be prevented. When the first insulator 170-1 is spaced apart from the first cover electrode 152, the first conductive semiconductor layer 121 may be exposed through a region between the first insulator 170-1 and the first cover electrode 152 and may be oxidized.

The second insulator 170-2 may be disposed on a side surface and the upper surface of the first cover electrode 152. Accordingly, permeation of moisture and contaminants into the semiconductor structure 120 can be prevented.

In addition, the insulating layer 170 may include a third insulator 170-3 interposed between the second conductive semiconductor layer 123 and the second cover electrode 162 and a fourth insulator 170-4 disposed on an upper surface of the second cover electrode 162.

The third insulator 170-3 may extend into the second cover electrode 162. Accordingly, permeation of moisture and contaminants into the second conductive semiconductor layer 123 may be prevented. When the third insulator 170-3 is spaced apart from the second cover electrode 162, the second conductive semiconductor layer 123 may be exposed through a region between the third insulator 170-3 and the second cover electrode 162 and may be oxidized.

In addition, the fourth insulator 170-4 may be disposed on a side surface and the upper surface of the second cover electrode 162. Accordingly, permeation of moisture and contaminants into the semiconductor structure 120 can be prevented.

The second cover electrode 162 may extend to a second spacer between the third insulator 170-3 and the side surface of the second electrode 161 and may be in contact with the second conductive semiconductor layer 123. Accordingly, a current injection efficiency can increase. A width of the second spacer may be in the range of about 1 μm to 10 μm, but is not limited thereto.

Figure 3A:
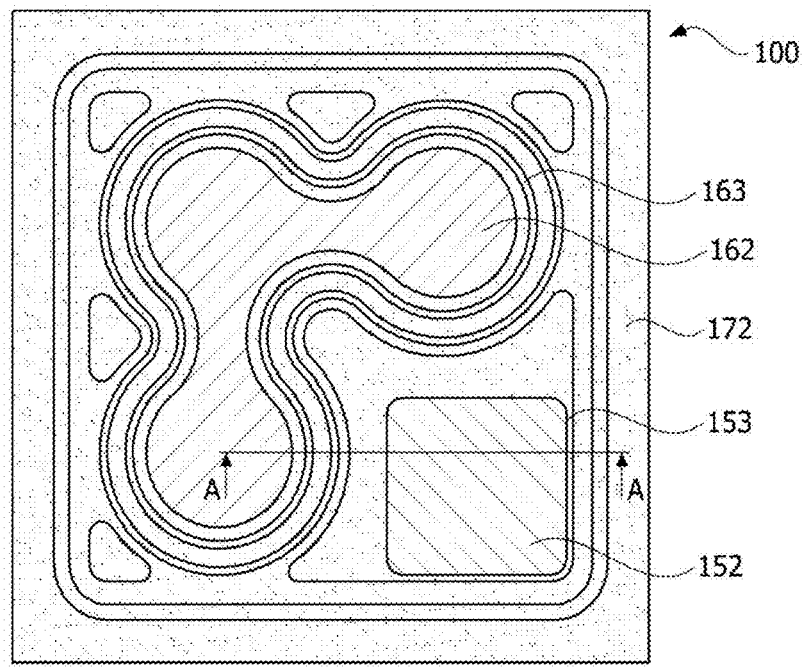
FIG. 3A is a plan view illustrating the semiconductor device according to one embodiment of the present disclosure.
Figure 3B:
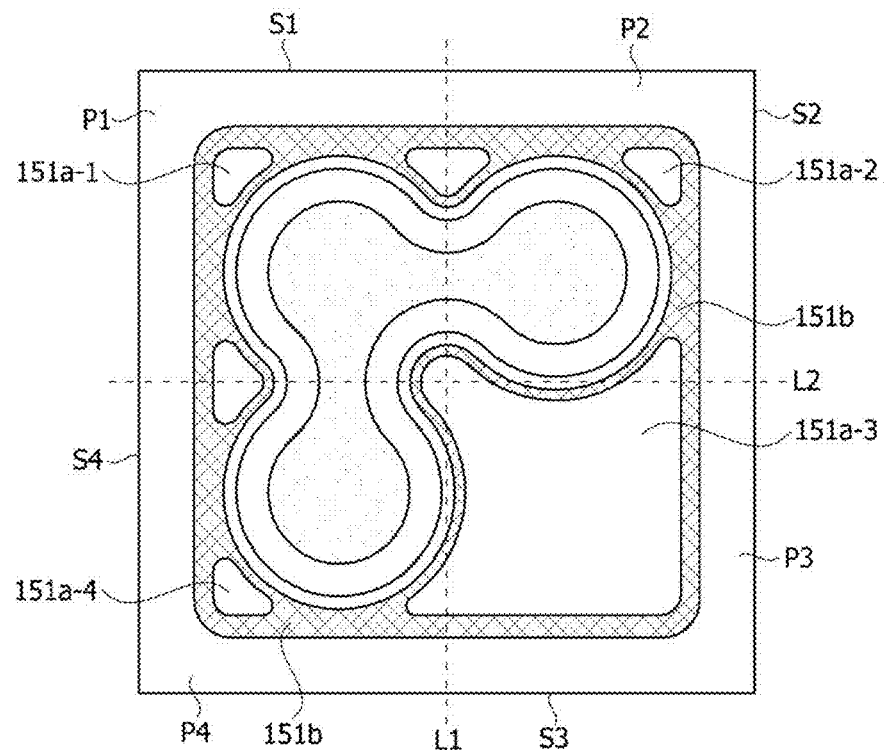
FIG. 3B is a plan view illustrating an etching region of a first electrode according to one embodiment of the present disclosure.
Figure 3C:
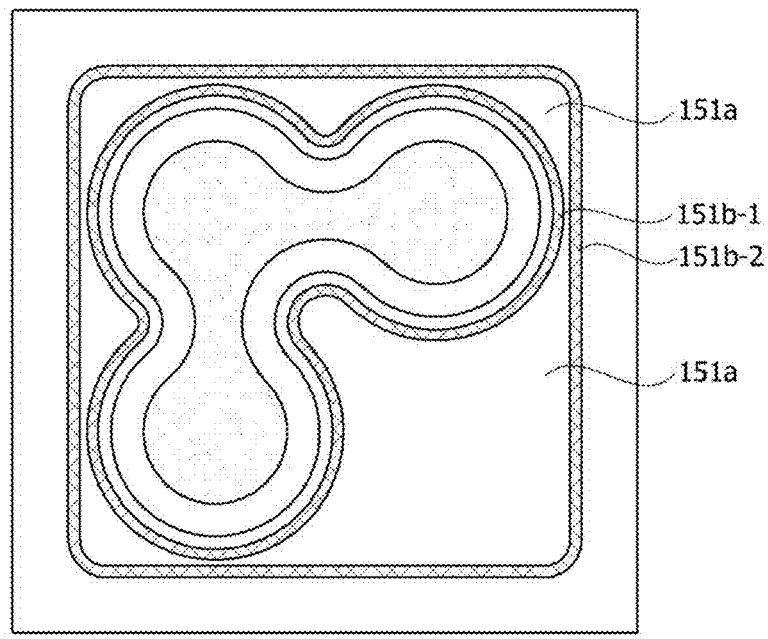
FIG. 3C is a view illustrating a modified embodiment of FIG. 3B.
Figure 3D:
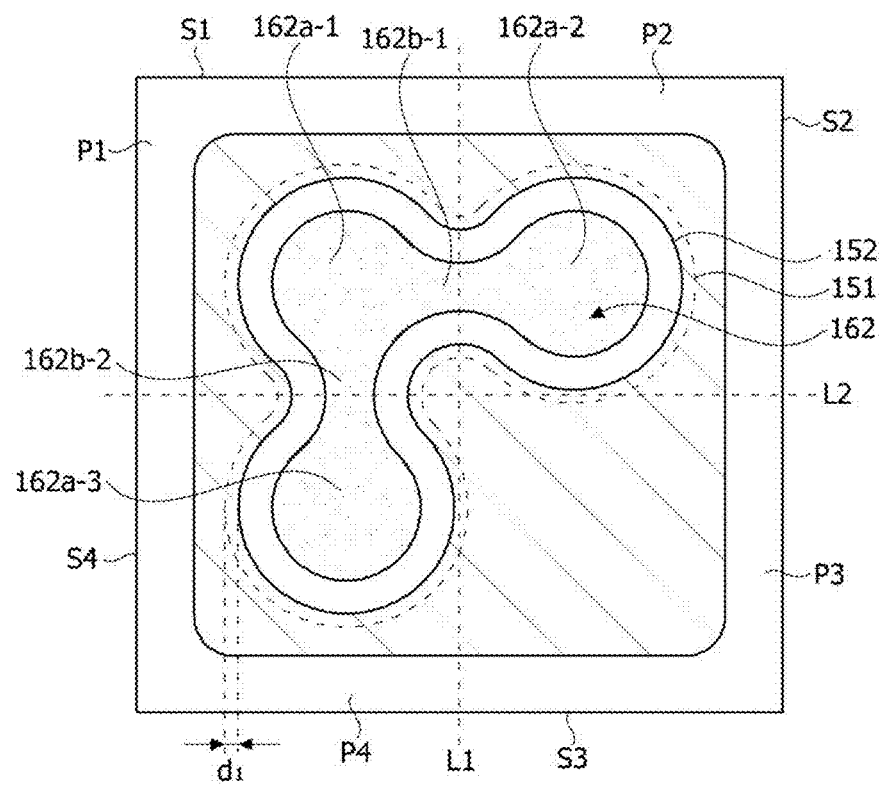
FIG. 3D is a plan view illustrating a first cover electrode and a second cover electrode according to one embodiment of the present disclosure.

FIG. 3A is a plan view illustrating the semiconductor device according to one embodiment of the present disclosure, FIG. 3B is a plan view illustrating an etching region of a first electrode according to one embodiment of the present disclosure, FIG. 3C is a view illustrating a modified embodiment of FIG. 3B, and FIG. 3D is a plan view illustrating a first cover electrode and a second cover electrode according to one embodiment of the present disclosure.

Referring to FIG. 3A, the first cover electrode 152 may be exposed through the third hole 153 of the second insulating layer 172, and the second cover electrode 162 may be exposed through the fourth hole 163 of the second insulating layer 172. The fourth hole 163 may have a shape corresponding to the second cover electrode 162, and the third hole 153 may have a rectangular shape and may be disposed in a third divided region among divided regions which will be described below. FIG. 1 is a cross-sectional view of FIG. 3A when seen in a direction of A-A.

Referring to FIG. 3B, the semiconductor structure may include a plurality of divided regions P1, P2, P3, and P4 defined by a first virtual line L1 passing through centers of a first side surface S1 and a third side surface S3 facing each other, and a second virtual line L2 passing through centers of a second side surface S2 and a fourth side surface S4 facing each other when seen from above. The first virtual line L1 may be perpendicular to the second virtual line L2, but is not limited thereto.

Here, the plurality of divided regions P1, P2, P3, and P4 may include the first divided region P1 having the first side surface S1 and the fourth side surface S4, the second divided region P2 having the first side surface S1 and the second side surface S2, the third divided region P3 having the second side surface S2 and the third side surface S3, and the fourth divided region P4 having the third side surface S3 and the fourth side surface S4.

The first grooves 151a may include a first-first groove 151a-1 disposed in the first divided region P1, a first-second groove 151a-2 disposed on the second divided region P2, a first-third groove 151a-3 disposed on the third divided region P3, and a first-fourth groove 151a-4 disposed on the fourth divided region P4.

The plurality of first grooves 151a may be disposed to be spaced apart from each other. To decrease the operation voltage of the semiconductor device, it may be advantageous to increase an area of the second electrode. Accordingly, since a space decreases, the first grooves 151a may be spaced apart from each other like islands. Here, each of the protrusions 151b may have a structure surrounding the corresponding first-first to first-fourth grooves 151a-1, 151a-2, 151a-3, and 151a-4.

Here, since the light emitting region and the second electrode are not disposed in the third divided region P3, the first-third groove 151a-3 may be larger than each of the first-first groove 151a-1, the first-second groove 151a-2, and the first-fourth groove 151a-4.

Referring to FIG. 3C, the plurality of grooves may be connected to form one first groove 151a. The protrusion may include a first protruding line (inner line) 151b-1 disposed inside the first groove 151a and a second protruding line (outer line) 151b-2 disposed outside the first groove 151a. According to the above-described structure, as a region in which an oxide film is removed increases, the operation voltage may decrease.

Referring to FIG. 3D, the second cover electrode 162 may include a plurality of pads 162a-1, 162a-2, and 162a-3 and connecting portions 162b-1 and 162b-2 connecting the plurality of pads. The second cover electrode 162 may have a dumbbell shape, but is not limited thereto. Each of the plurality of pads 162a-1, 162a-2, and 162a-3 may have a circle shape, but is not limited thereto, and may have one of various shape.

The plurality of pads 162a-1, 162a-2, and 162a-3 may include the first pad 162a-1 disposed in the first divided region P1, the second pad 162a-2 disposed in the second divided region P2, and the third pad 162a-3 disposed in the fourth divided region P4.

The connecting portions 162b-1 and 162b-2 may include the first connecting portion 162b-1 connecting the first pad 162a-1 and the second pad 162a-2, and the second connecting portion 162b-2 connecting the second pad 162a-2 and the third pad 162a-3. Here, each of the plurality of pads 162a-1, 162a-2, and 162a-3 may be defined as a region having a circle shape, and the connecting portions 162b-1 and 162b-2 may be defined as remaining regions connecting the circular pads 162a-1 and 162a-2, and s62a-3. The circle shape of each of the plurality of pads 162a-1, 162a-2, and 162a-3 may be a virtual circle shape in which a curvature of a region other than regions connected to the connecting portions 162b-1 and 162b-2 extends.

Here, a width of the first connecting portion 162b-1 may decrease as the first connecting portion 162b-1 is closer the first virtual line L1, and a width of the second connecting portion 162b-2 may decrease as the second connecting portion 162b-2 is closer to the second virtual line L2. That is, the first connecting portion 162b-1 may have a smallest width at a central position between the first pad 162a-1 and the second pad 162a-2.

According to the above-described structure, an outer circumferential surface of the second cover electrode 162 may increase, and a space in which the first groove is formed may be provided outside the connecting portion. In addition, a probability in which light is emitted through the outer circumferential surface increases so that an optical output can be improved. In addition, the plurality of pads can be formed. Although the ultraviolet light emitting device according to the embodiment may generate a large amount of heat when compared to a visible light emitting device, a heat dissipation efficiency can increase since the plurality of bump electrodes are provided.

A ratio between an area of the first divided region P1 and an area of the second cover electrode 162 disposed in the first divided region may be in the range of 1:0.2 to 1:0.5. The area of the second cover electrode 162 disposed in the first divided region P1 may be an area of the first pad 162a-1 and an area of the second connecting portion 162b-2 disposed in the first divided region.

In a case in which the area ratio is 1:0.2 or more, the area of the second cover electrode 162 increases so that a hole injection efficiency can be improved. In addition, since an area of the first pad 162a-1 increases, a size of the bump electrode may increase. Accordingly, the heat dissipation efficiency may increase.

In a case in which the area ratio is 1:0.5 or less, the area of the first cover electrode 152 in the first divided region P1 may increase so that an electron injection efficiency can be improved. In addition, a space in which the plurality of first grooves 151a are formed may be provided outside the second cover electrode 162. Accordingly, the operation voltage can decrease.

A ratio between an area of the second divided region P2 and the area of the second cover electrode 162 disposed in the second divided region may also be in the range of 1:0.2 to 1:0.5. In addition, an area ratio between an area of the third divided region P3 and the area of the second cover electrode 162 disposed in the third divided region may also be in the range of 1:0.2 to 1:0.5.

That is, according to the embodiment, the areas of the second cover electrodes 162 disposed in the divided regions P1, P2, and P3 may be the same.

An area ratio between the second cover electrode 152 and the first cover electrode 162 may be in the range of 1:1.1 to 1:1.15. That is, the area of the first cover electrode 152 may be greater than that of the second cover electrode 162. In a case in which the area ratio is 1:1.1 or more, the area of the first cover electrode 152 increases so that the electron injection efficiency can be improved. In addition, a space in which the plurality of first grooves 151a are formed may be provided outside the second cover electrode 162. Accordingly, the operation voltage can decrease.

In a case in which the area ratio is 1:1.15 or less, the area of the second cover electrode 162 increases, and thus the hole injection efficiency can be improved. In addition, since areas of the pads increase, sizes of the bump electrodes can increase. Accordingly, the heat dissipation efficiency can increase.

FIGS. 4 to 9 are plan views and cross-sectional views illustrating a method of manufacturing the semiconductor device according to one embodiment of the present disclosure.

Figure 4:
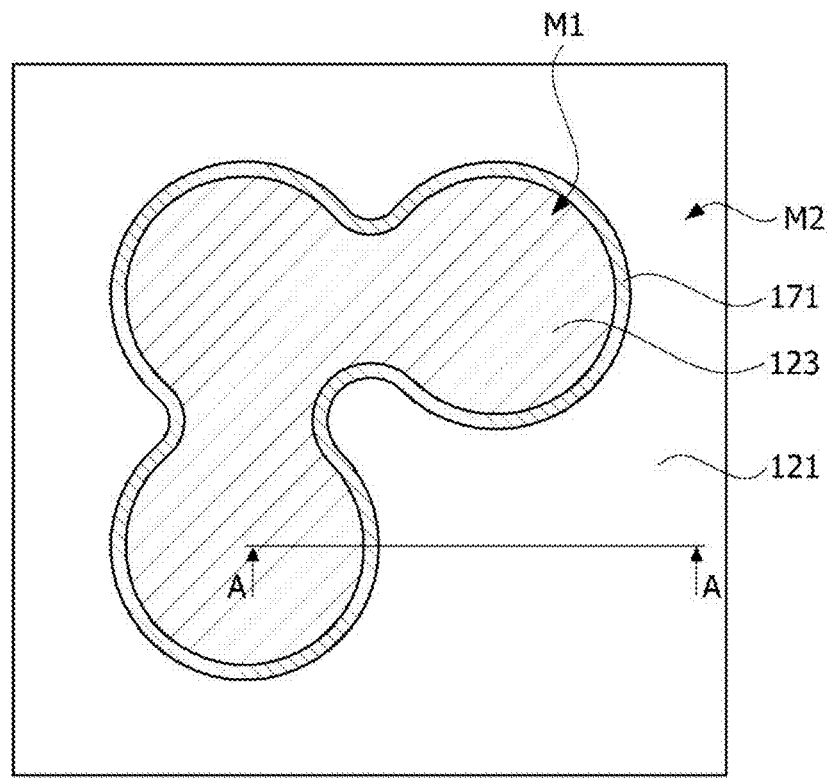
FIG. 4 is a plan view and a cross-sectional view illustrating a light emitting region formed by a mesa etching process.
Figure 4:
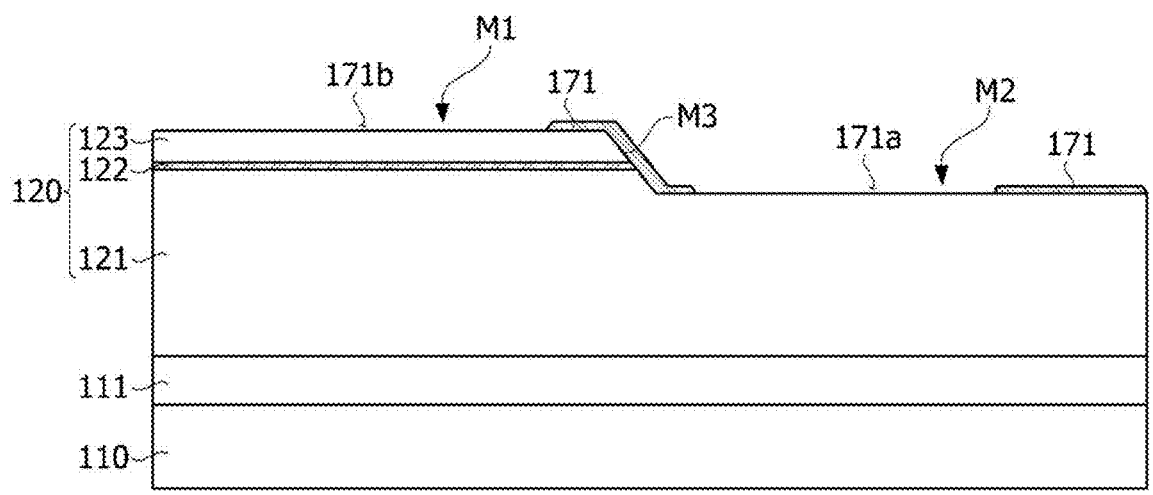

Referring to FIG. 4, the first conductive semiconductor layer 121, the active layer 122, and the second conductive semiconductor layer 123 may be sequentially formed on the substrate 110. Next, the semiconductor structure may be mesa-etched to form the non-light emitting region M2 through which the first conductive semiconductor layer 121 is exposed and the light emitting region M1 protruding when compared to the non-light emitting region M2. Next, the first insulating layer 171 may be formed, and the first hole 171a and the second hole 171b may be formed. Accordingly, the first insulating layer 171 may be mainly disposed on a side surface of the light emitting region M1.

The mesa-etched light emitting region M1 may include connecting sections which connect a plurality of circular sections when seen from above. According to the above-described structure, since a bump pad may be disposed on each of the circular sections, the heat dissipation efficiency can be improved. Since the semiconductor device according to the embodiment is the ultraviolet light emitting device, the semiconductor device may be a GaN-based semiconductor material including a large amount of aluminum when compared to a general visible light emitting device. Accordingly, since a large amount of heat is generated due to a resistance, dissipating the heat may be a big issue.

At least a part of the side surface of the second conductive semiconductor layer 123, the side surface of the active layer 122, the side surface of the first conductive semiconductor layer 121 may be exposed to an inclined surface M3 between the light emitting region M1 and the non-light emitting region M2. Since the semiconductor structure according to the embodiment includes a large amount of aluminum, the semiconductor structure may be easily oxidized due to moisture and damaged due to the other contaminants. Accordingly, the light emitting region M1 and the non-light emitting region M2 are formed, and then the first insulating layer 171 may be disposed in the inclined surface M3 between the light emitting region M1 and the non-light emitting region M2 to prevent damage of the inclined surface.

Figure 5:
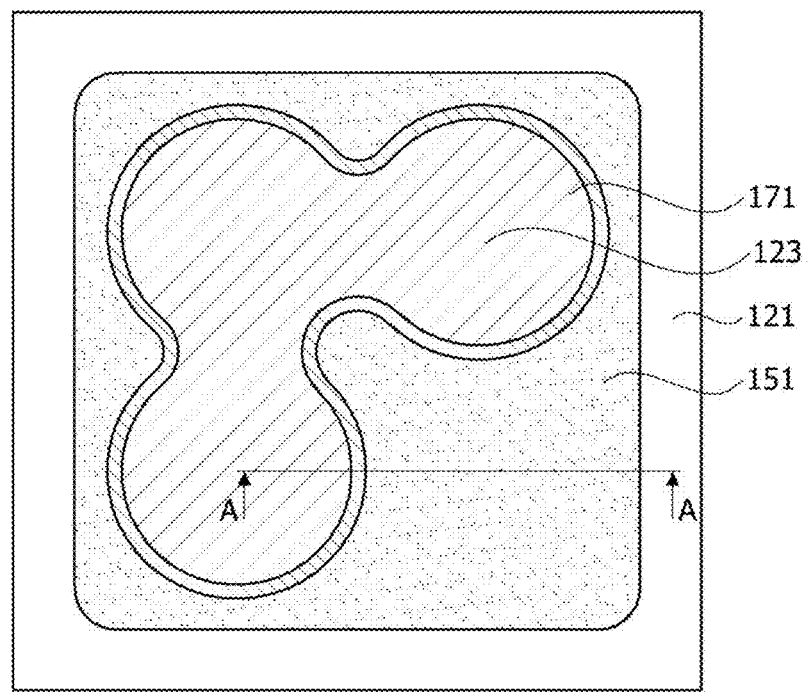
FIG. 5 is a plan view and a cross-sectional view illustrating the first electrode.
Figure 5:
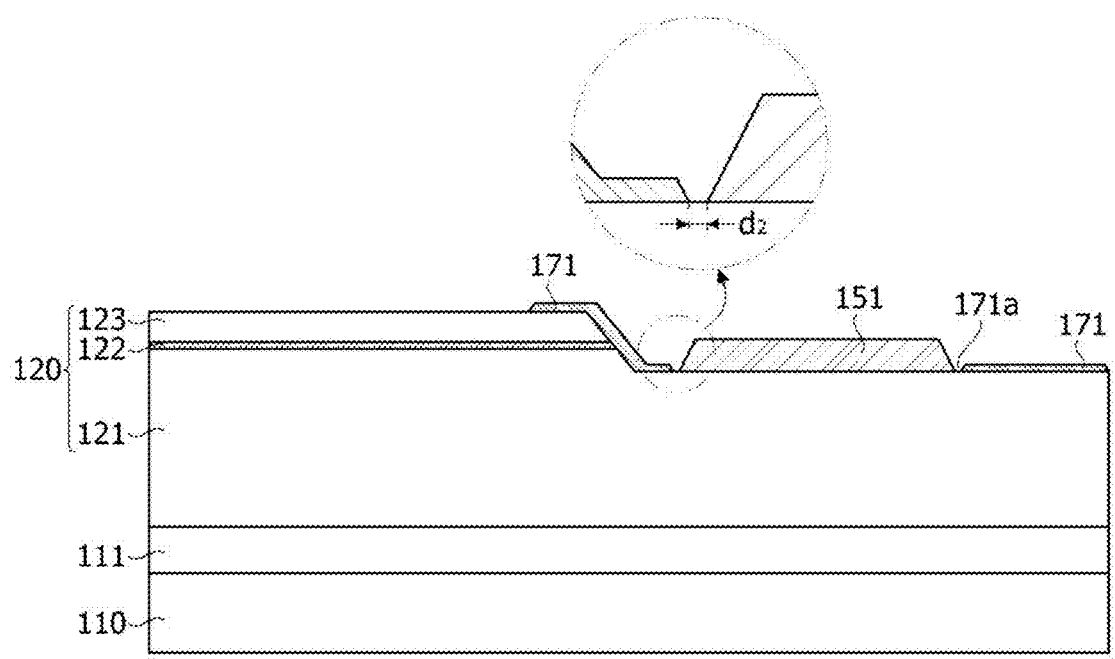

Referring to FIG. 5, the first electrode 151 may be formed on the first conductive semiconductor layer 121. Specifically, the first electrode 151 may be disposed in the first hole 171a of the first insulating layer 171.

According to the embodiment, an area of the first hole 171a may be greater than that of a lower surface of the first electrode 151. For example, a distance of the spacer d2 between the first electrode 151 and the first insulating layer 171 may be in the range of 1 um to 10 um.

The current injection efficiency may be improved as an area in which the first electrode 151 is in contact with the first conductive semiconductor layer 121 increases, and when the distance of the gap is 1 um or more, a process margin in which a contact area is secured in a given area of the first electrode 151 may be provided. In addition, as described above, a first cover electrode 152 may be disposed within the distance of the spacer d2 between the first electrode 151 and the first insulating layer 171, and the distance of the spacer may be 10 um or less to secure distribution characteristics of current injected to the total region of the semiconductor structure in consideration of current injection and current distribution characteristics. In addition, a thickness of the first electrode 151 may be greater than that of the first insulating layer 171.

Figure 6:
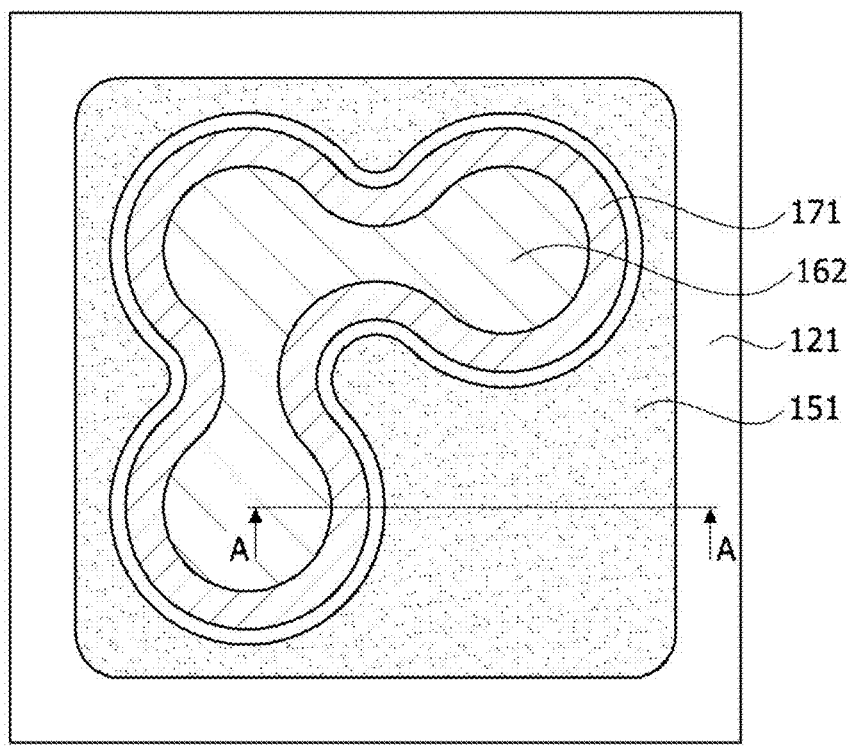
FIG. 6 is a plan view and a cross-sectional view illustrating a second electrode.
Figure 6:
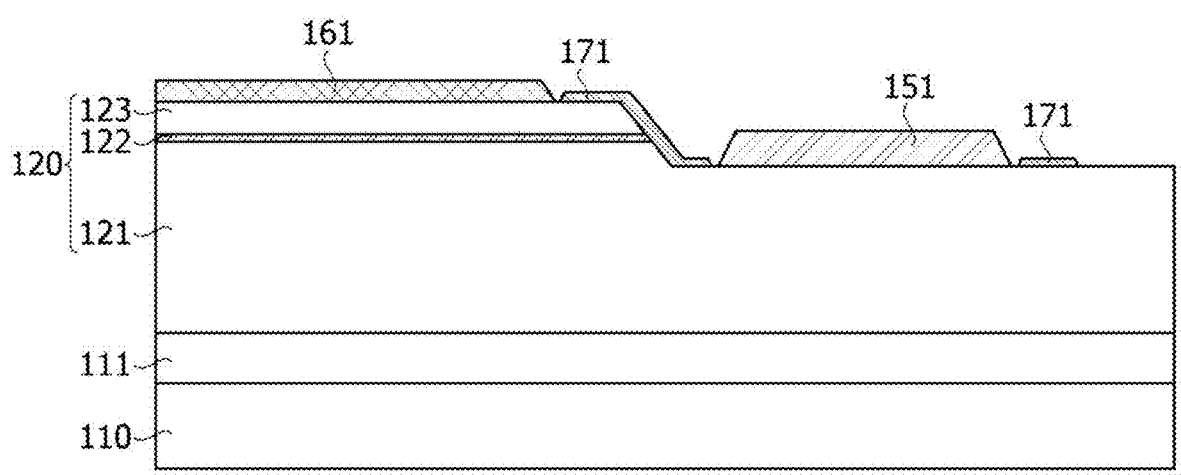

Next, the second electrode 161 may be formed in the light emitting region as illustrated in FIG. 6.

A method of forming the first electrode 151 and the second electrode 161 may be the same as a method of forming a general ohmic electrode. The first electrode 151 may be formed of at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but is not limited thereto. For example, the first electrode 151 may include a plurality of metal layers (for example, Cr/Al/Ni), and the second electrode 161 may include ITO, but are not limited thereto.

Figure 7:
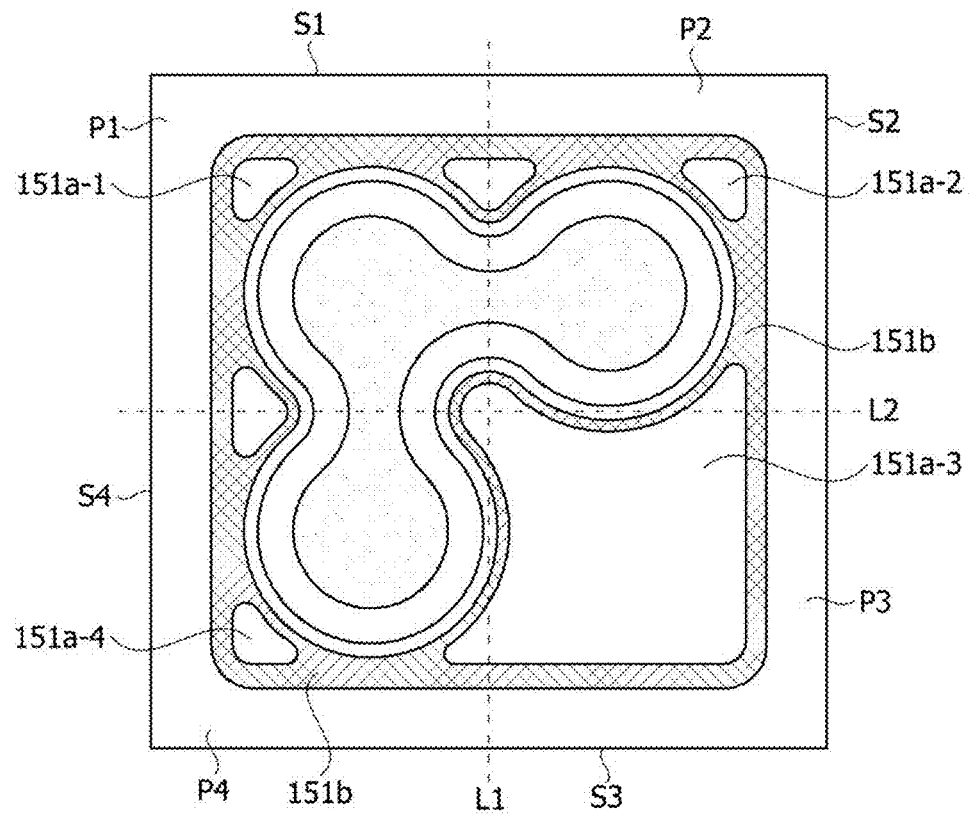
FIG. 7 is a plan view and a cross-sectional view illustrating a first groove formed by the first electrode being etched.
Figure 7:
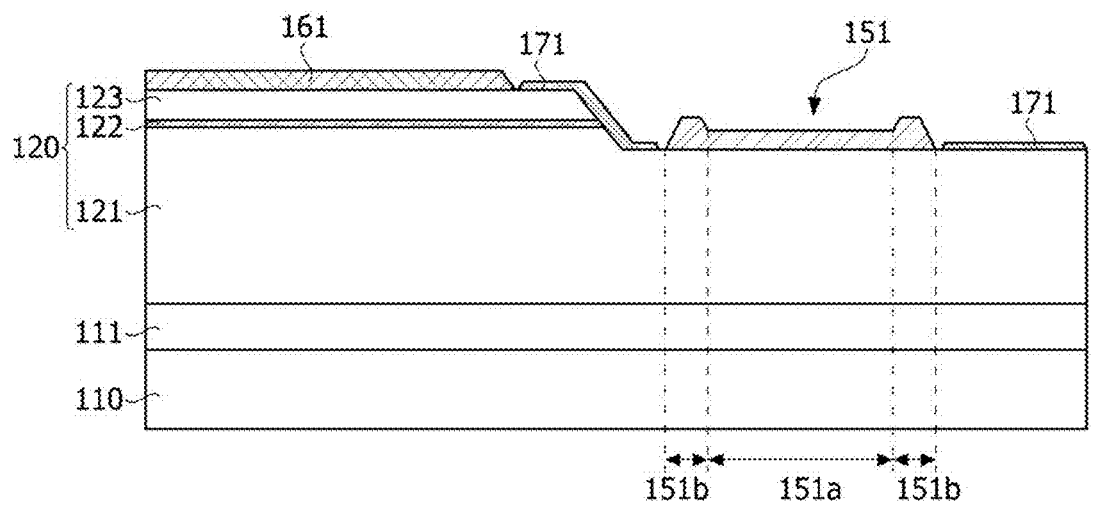

Referring to FIG. 7, a process of etching the first electrode 151 may be performed. According to the present embodiment, a heat treatment temperature of an electrode of a light emitting device configured to emit deep ultraviolet light may increase because of including aluminum of which a composition ratio is higher than that of a general visible light emitting device. To improve ohmic characteristics between the semiconductor structure and the first electrode 151 and/or the second electrode 161, the heat treatment may be performed at a temperature of in the range of about 600° C. to 900° C. During the heat treatment, the oxide film may be formed on the surface of the first electrode 151. Accordingly, an upper surface of the first electrode 151 may be etched to remove the oxide film so that electrical connection between the first electrode 151 and the cover electrode can be improved.

In addition, during the heat treatment of the first electrode 151 and/or the second electrode 161, oxidation and/or corrosion may occur on the side surface first conductive semiconductor layer 121, the side surface of the active layer 122, and/or the side surface of the second conductive semiconductor layer 123 which are exposed between the light emitting region and the non-light emitting region. To prevent the above-described problem, the first insulating layer 171 may be interposed between the non-light emitting region and the light emitting region so that the oxidation and/or corrosion of the side surface of the first conductive semiconductor layer 121, the side surface of the active layer 122, and/or the side surface of the second conductive semiconductor layer 123 can be prevented.

The semiconductor structure may include the plurality of divided regions P1, P2, P3, and P4 defined by the first virtual line L1 passing through the centers of the first side surface S1 and the third side surface S3 which face each other and the second virtual line L2 passing through the centers of the second side surface S2 and the fourth side surface S4 which face each other. The first virtual line L1 may be perpendicular to the second virtual line L2, but is not limited thereto.

Here, the plurality of divided regions P1, P2, P3, and P4 may include the first divided region P1 having the first side surface S1 and the fourth side surface S4, the second divided region P2 having the first side surface S1 and the second side surface S2, the third divided region P3 having the second side surface S2 and the third side surface S3, and the fourth divided region P4 having the third side surface S3 and the fourth side surface S4.

The first grooves 151a may include the first-first groove 151a-1 disposed in the first divided region P1, the first-second groove 151a-2 disposed in the second divided region P2, the first-third groove 151a-3 disposed in the third divided region P3, and the first-fourth groove 151a-4 disposed in the fourth divided region P4. That is, the plurality of first grooves 151a may be spaced apart from each other. To decrease the operation voltage, it may be advantageous to increase the area of the second electrode. Accordingly, since a space decreases, the first grooves 151a may be spaced apart from each other like islands. Here, each of the protrusions 151b may have a structure surrounding the corresponding first-first to first-fourth grooves 151a-1, 151a-2, 151a-3, and 151a-4.

Here, since the light emitting region is not disposed in the third divided region P3, the first-third groove 151a-3 may be disposed to be larger than each of the first-first groove 151a-1, the first-second groove 151a-2, and the first-fourth groove 151a-4.

Figure 8:
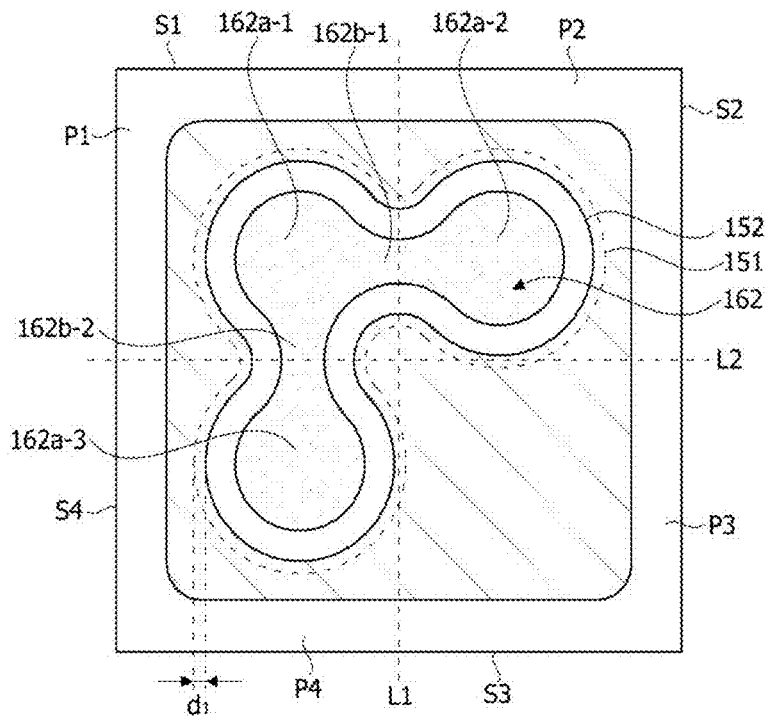
FIG. 8 is a plan view and a cross-sectional view illustrating the first cover electrode and the second cover electrode.
Figure 8:
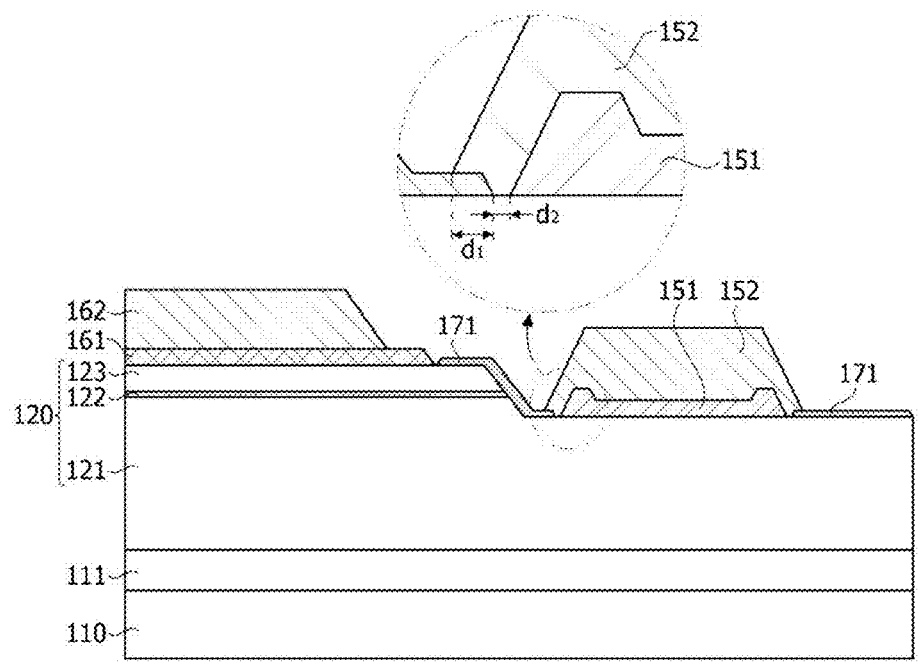

Referring to FIG. 8, the first cover electrode 152 may be disposed on the first electrode 151. Here, the first groove 151a may be disposed on one surface of the first electrode 151, and the first cover electrode 152 may include the first irregularity 152a disposed in the first groove 151a. According to the above-described structure, electrical connection between the first cover electrode 152 and the first electrode 151 may be improved so that the operation voltage can decrease. In a case in which the first groove 151a is not formed in the first electrode 151, since an oxide film is not removed, the electrical connection between the first cover electrode 152 and the first electrode 151 may be weakened.

The first cover electrode 152 may be formed to be large to cover the side surface of the first electrode 151 and a part of the first insulating layer 171. The first cover electrode 152 may include the second irregularity 152b disposed in the spacer d2 between the first insulating layer 171 and the first electrode 151. The second irregularity 152b may be in direct contact with the first conductive semiconductor layer 121. Accordingly, the current injection efficiency can be improved.

The second cover electrode 162 may be disposed on the second electrode 161. The first cover electrode 152 may cover the side surface of the second electrode 161.

Each of the first cover electrode 152 and the second cover electrode 162 may be formed of at least one among Ni/Al/Au, Ni/$IrO_x$/Au, Ag, Ni, Cr, Ti, Al, Rh, Pd, Ir, Sn, In, Ru, Mg, Zn, Pt, Au, and Hf, but is not specifically limited. However, an externally exposed outermost layer of each of the first cover electrode 152 and the second cover electrode 162 may include Au.

Figure 9:
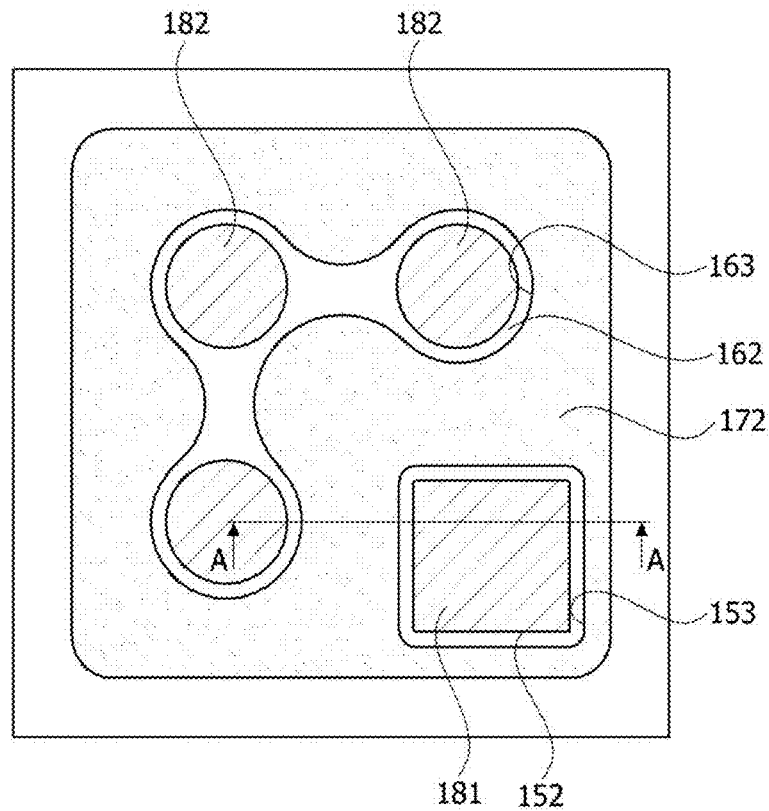
FIG. 9 is a plan view and a cross-sectional view illustrating a second insulating layer.
Figure 9:
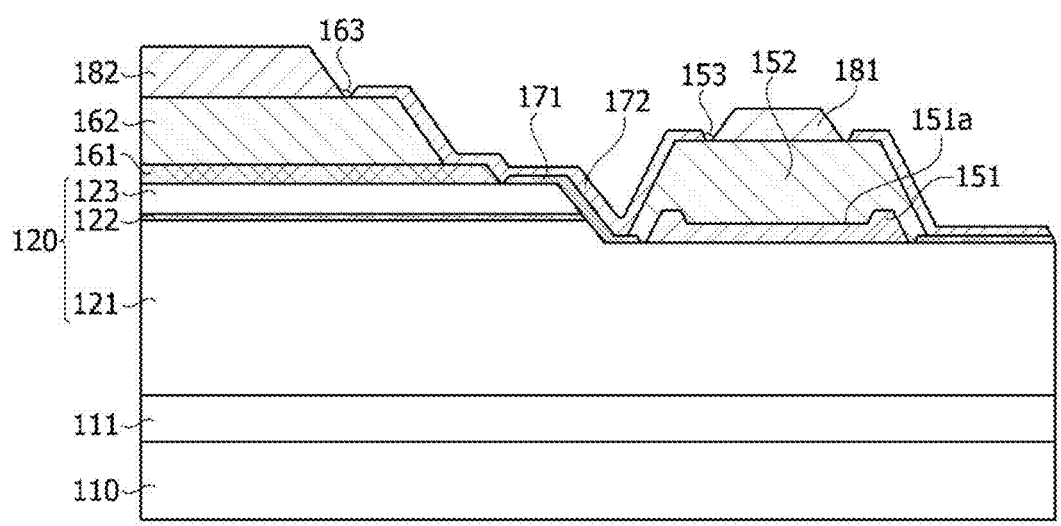
Figure 10:
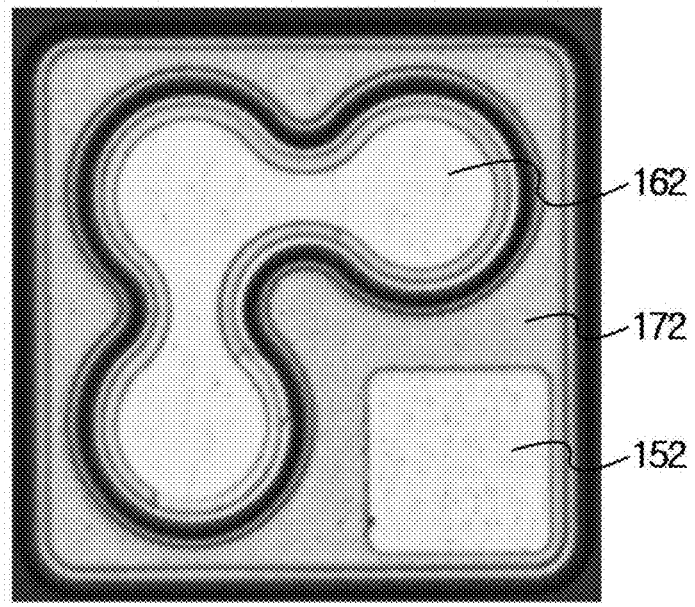
FIG. 10 is an image of the semiconductor device according to one embodiment of the present disclosure when seen from above.

Referring to FIGS. 9 and 10, the second insulating layer 172 may be disposed on the first cover electrode 152, the second cover electrode 162, and the first insulating layer 171. The second insulating layer 172 may include the third hole 153 through which the first cover electrode 152 is exposed and the fourth hole 163 through which the second cover electrode 162 is exposed.

Here, a ratio between the area of the first cover electrode 152 exposed through the third hole 153 and the area of the second cover electrode 162 exposed through the fourth hole 163 may be in the range of 1:2 to 1:5. In a case in which the area ratio is 1:2 or more, the area of the second cover electrode 162 increases so that the hole injection efficiency can be improved. In addition, since the area of the first pad 162a-1 increases, the size of the bump electrode can increase. Accordingly, the heat dissipation efficiency can increase. In a case in which the area ratio is 1:5 or less, the area of the first cover electrode 152 increases so that the electron injection efficiency can be improved.

Additionally, the first bump electrode 181 may be further disposed on the first cover electrode 152, and the second bump electrode 182 may be further disposed on the second cover electrode 162, but are not limited thereto. The first bump electrode 181 and the second bump electrode 182 may also be formed when the chip is mounted on the circuit substrate.

Although not illustrated in the drawings, the first bump electrode 181 may extend onto the second insulating layer 172, and the second bump electrode 182 may extend onto the second insulating layer 172. According to the above-described structure, gaps between the bump electrodes 181 and 182 and the second insulating layer 172 are covered so that permeation of moisture can be prevented.

Figure 11:
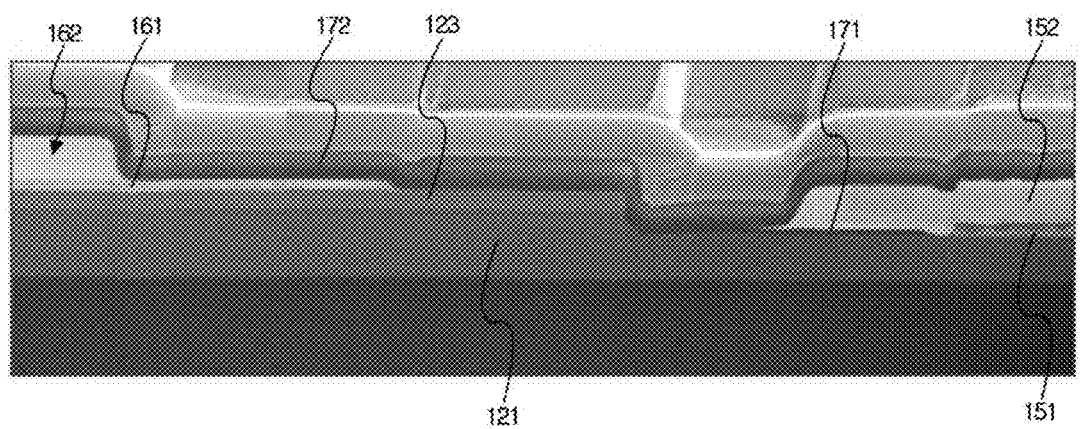
FIG. 11 is an image of a cross section of the semiconductor device according to one embodiment of the present disclosure.

Referring to FIG. 11, each of the first insulating layer 171 and the second insulating layer 172 may be formed of at least one selected from the group consisting of SiO2, SixOy, Si3N4, SixNy, SiOxNy, Al2O3, TiO2, AlN, and the like. In addition, the first insulating layer 171 and the second insulating layer 172 may be formed of the same material. Accordingly, the first insulating layer 171 and the second insulating layer 172 formed of the same material may be disposed at least a part of the side surface of the first conductive semiconductor layer 121, the side surface of the active layer 122, and the side surface of the second conductive semiconductor layer 123 between the light emitting region and the non-light emitting region. However, the first insulating layer 171 and the second insulating layer 172 are not limited thereto, and may also include different materials.

The first insulating layer 171 horizontally extends under the second insulating layer 172 between the light emitting region and the non-light emitting region, and is spaced apart from the first electrode 151, and the first cover electrode 152 is disposed on a part of the first electrode 151 and a part of the first insulating layer 171, and thus the first cover electrode 152 may be disposed to vertically overlap the part of the first insulating layer 171 and the part of the second insulating layer 172.

Figure 12:
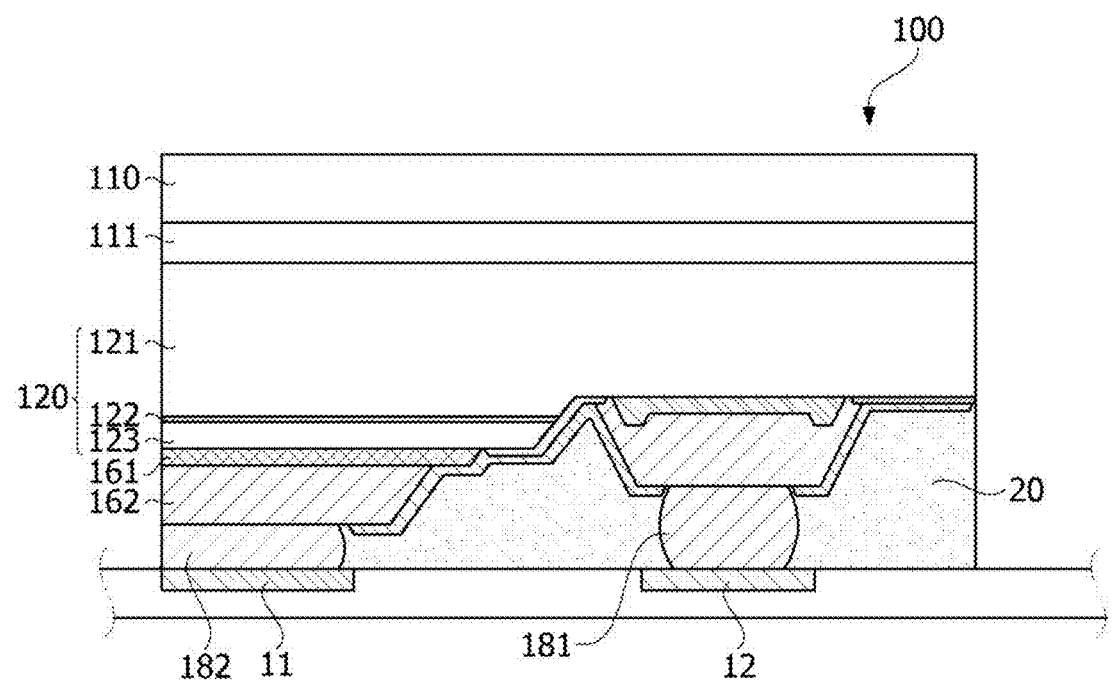
FIG. 12 is a view illustrating a package of the semiconductor device according to one embodiment of the present disclosure.

Referring to FIG. 12, the semiconductor device 100 according to the embodiment may be mounted on the circuit substrate 10 as the flip chip type semiconductor device 100. The semiconductor device 100 may include all of the above-described components. For example, the first bump electrode 181 and the second bump electrode 182 may be respectively electrically connected to and mounted on electrode pads 11 and 12 of the circuit substrate 10. Here, various filling members 20 may be disposed between the semiconductor device 100 and the circuit substrate 10. For example, the filling member may include a material (for example, aluminum) reflecting ultraviolet light.

The semiconductor device may be applied to various kinds of light source devices. For example, the light source devices may include sterilizers, curing devices, lighting devices, display devices, vehicle lamps, and the like. That is, the semiconductor device may be disposed in a case and applied to various electronic devices configured to provide light.

The sterilizer may include the semiconductor device according to the embodiment to sterilize a desired region. The sterilizer may be applied to a water purifier, an air conditioner, a refrigerator, and the like, but is not limited thereto. That is, the sterilizer may be applied to all various apparatuses (for example, a medical device) which need sterilizing.

For example, the water purifier may include the sterilizer according to the embodiment to sterilize circulating water. The sterilizer may be disposed at a nozzle through which water circulates or a discharging port to emit ultraviolet light. Here, the sterilizer may include a water proof structure.

The curing device may include the semiconductor device according to the embodiment to cure various kinds of liquids. The liquids may include all materials which are cured when exposed to ultraviolet light. For example, the curing device may cure various kinds of resins. In addition, the curing device may also be applied to cure a cosmetic product such as nail polish.

The lighting device may include a substrate, a light source module having the semiconductor device according to the embodiment, a radiator configured to radiate heat of the light source module, and a power source configured to process or convert an externally received electric signal to provide the electric signal to the light source module. In addition, the lighting device may include a lamp, a head lamp, a street light, or the like.

The display device may include a bottom cover, a reflective plate, a light emitting module, a light guide plate, an optical sheet, display panel, an image signal output circuit, and a color filter. The bottom cover, the reflective plate, the light emitting module, the light guide plate, and the optical sheet may form a backlight unit.

The reflective plate may be disposed above the bottom cover, and the light emitting module may emit light. The light guide plate may be disposed in front of the reflective plate to guide the light emitted by the light emitting module forward. The optical sheet may include a prism sheet and the like and may be disposed in front of the light guide plate. The display panel may be disposed in front of the optical sheet, the image signal output circuit may send an image signal to the display panel, and the color filter may be disposed in front of the display panel.

When the semiconductor device is used for the backlight unit of the display device, the semiconductor device may be used for an edge type backlight unit or direct type backlight unit.

As described above, a flip chip type ultraviolet light emitting device can be manufactured.

In addition, an operation voltage can be decreased.

Various useful advantages and effects of the present disclosure are not limited to the above-described advantages, and may be understood in a process in which specific embodiments are described.

The embodiments have been particularly described, but are only examples, and do not limit the present disclosure. It will be understood by those skilled in the art that various changes and applications that are not illustrated above will be made within a range without departing from the essential characteristics of the present disclosure. For example, the components specifically described in the embodiments may be changed. In addition, it should be interpreted that differences related to the changes and applications fall within the scope of the present disclosure defined by the appended claims.

What is claimed is:

1. A semiconductor device comprising:
    a semiconductor structure including a first semiconductor layer, a second semiconductor layer, and an active layer interposed between the first semiconductor layer and the second semiconductor layer;
    a first electrode disposed on the first semiconductor layer;
    a second electrode disposed on the second semiconductor layer;
    a first cover electrode disposed on the first electrode; and
    a second cover electrode disposed on the second electrode,
    wherein:
        the second cover electrode includes a plurality of pads, and connecting portions configured to connect the plurality of pads, and
        a width of each of the connecting portions is smallest at a central position between the adjacent pads,
    wherein the first electrode includes a first groove provided on an upper surface of the first electrode, and a protrusion configured to surround the first groove, and
    wherein the first cover electrode is provided on the first groove and the protrusion.

2. The semiconductor device of claim 1, further comprising:
- a first insulating layer disposed on the semiconductor structure; and
- a second insulating layer disposed on the first cover electrode and the second cover electrode,
- wherein
  - the first insulating layer includes a first hole in which the first electrode is disposed and a second hole in which the second electrode is disposed, and
  - the second insulating layer includes a third hole through which a part of the first cover electrode is exposed and a fourth hole through which a part of the second cover electrode is exposed.

3. The semiconductor device of claim 1, wherein the semiconductor structure includes:
- a non-light emitting region in which the first semiconductor layer is exposed; and
- a light emitting region including the active layer and the second semiconductor layer.

4. The semiconductor device of claim 2, wherein:
- the semiconductor structure includes a plurality of divided regions defined by a first virtual line passing through centers of a first side surface and a third side surface and a second virtual line passing through centers of a second side surface and a fourth side surface;
- the plurality of divided regions includes a first divided region having a first side surface and a fourth side surface, a second divided region having the first side surface and a second side surface, a third divided region having the second side surface and a third side surface, and a fourth divided region having the third side surface and the fourth side surface;
- the plurality of pads include a first pad disposed in the first divided region, a second pad disposed in the second divided region, and a third pad disposed in the fourth divided region; and
- the connecting portions include a first connecting portion configured to connect the first pad and the second pad, and a second connecting portion configured to connect the first pad and the third pad.

5. The semiconductor device of claim 4, wherein:
- a width of the first connecting portion decreases as the first connecting portion is closer to the first virtual line; and
- a width of the second connecting portion decreases as the second connecting portion is closer to the second virtual line.

6. The semiconductor device of claim 4, wherein the third hole is disposed in the third divided region.

7. The semiconductor device of claim 6, wherein the fourth hole has a shape corresponding to that of the second cover electrode.

8. The semiconductor device of claim 7, further comprising:
- a plurality of first bump electrodes disposed on the first cover electrode via the third hole; and
- a second bump electrode disposed on the second cover electrode via the fourth hole,
- wherein the plurality of first bump electrodes are disposed on the pads of the second cover electrode.

9. The semiconductor device of claim 7, wherein a ratio between an area of the first cover electrode exposed through the third hole and an area of the second cover electrode exposed through the fourth hole is in a range of 1:2 to 1:5.

10. The semiconductor device of claim 4, wherein a ratio between an area of the first divided region and an area of the second cover electrode disposed in the first divided region is in a range of 1:0.2 to 1:0.5.

11. The semiconductor device of claim 1, further comprising an oxide film interposed between the protrusion and the first cover electrode.

12. The semiconductor device of claim 1, wherein:
- the first cover electrode includes a first irregularity disposed in the first groove, and a second irregularity disposed in a spacer between the first insulating layer and the first electrode; and
- the second irregularity is in contact with the first semiconductor layer.

13. The semiconductor device of claim 1, wherein the first cover electrode extends onto the first insulating layer.

14. The semiconductor device of claim 1, wherein the active layer generates light of an ultraviolet light wavelength band.

15. The semiconductor device of claim 1, wherein an area ratio between the second cover electrode and the first cover electrode is in a range of 1:1.1 to 1:1.5.

* * * * *